(12) United States Patent
Rahman

(10) Patent No.: US 7,727,896 B1
(45) Date of Patent: Jun. 1, 2010

(54) STACKED DIE MANUFACTURING PROCESS

(75) Inventor: Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/266,194

(22) Filed: Nov. 6, 2008

(51) Int. Cl.
*H01L 21/311* (2006.01)

(52) U.S. Cl. .................. 438/700; 438/106; 438/637; 257/E21.17; 257/E21.249; 257/E21.304; 257/E21.499; 257/E21.511; 257/E21.585

(58) Field of Classification Search .............. 438/106, 438/458, 637, 679, 692, 672, 700; 257/E21.17, 257/249, 304, 499, 511, 585
See application file for complete search history.

(56) References Cited

U.S. PATENT DOCUMENTS

| | | | | |
|---|---|---|---|---|
| 6,794,272 | B2 * | 9/2004 | Turner et al. | 438/459 |
| 7,118,992 | B2 * | 10/2006 | Turner et al. | 438/459 |
| 7,605,460 | B1 * | 10/2009 | Wu et al. | 257/691 |
| 2006/0038272 | A1 * | 2/2006 | Edwards | 257/686 |
| 2009/0224400 | A1 * | 9/2009 | Rahman | 257/713 |

* cited by examiner

*Primary Examiner*—David Nhu
(74) *Attorney, Agent, or Firm*—Kenneth Glass; Thomas George

(57) ABSTRACT

A method for forming a stacked-die structure is disclosed in which a buried oxide layer is formed in a semiconductor wafer. Device layers and metal layers are formed on the face side of the semiconductor wafer, defining dice, with each die including an interconnect region. Openings are etched in the interconnect regions that extend through the semiconductor wafer so as to expose portions of the buried oxide layer. Conductive material is deposited within the openings so as to form through-die vias. The semiconductor wafer is then attached to a wafer support structure and material is removed from the backside of the semiconductor wafer so as to form an oxide layer having a thickness that is less than the initial thickness of the buried oxide layer. Openings are then etched within the backside of the semiconductor wafer so as to expose the through-die vias, micro-bumps are deposited over the through-die vias, and stacked dice are attached to the micro-bumps so as to electrically couple the stacked dice to the through-die vias. Thereby, a stacked die structure is formed that includes an oxide layer on the backside of the base die. Since the method does not include any high temperature process steps after the semiconductor wafer has been attached to the wafer support structure, thermally-released double-sided tape or adhesive having a low thermal budget can be used to attach the semiconductor wafer to the wafer support structure.

20 Claims, 12 Drawing Sheets

100

```
┌─────────────────────────────────────────────────────────┐
│ FORM BURIED OXIDE LAYER IN A SEMICONDUCTOR WAFER,       │
│ THE BURIED OXIDE LAYER HAVING AN INITIAL THICKNESS      │──101
└─────────────────────────────────────────────────────────┘
                            │
┌─────────────────────────────────────────────────────────┐
│ FORM DEVICE LAYERS ON FACE SIDE OF SEMICONDUCTOR WAFER  │──102
└─────────────────────────────────────────────────────────┘
                            │
┌─────────────────────────────────────────────────────────┐
│          FORM METAL LAYERS OVER DEVICE LAYERS           │──103
└─────────────────────────────────────────────────────────┘
                            │
┌─────────────────────────────────────────────────────────┐
│  ETCH OPENINGS IN INTERCONNECT REGIONS TO EXPOSE        │
│         PORTIONS OF BURIED OXIDE LAYER                  │──104
└─────────────────────────────────────────────────────────┘
                            │
┌─────────────────────────────────────────────────────────┐
│      DEPOSIT CONDUCTIVE MATERIAL WITHIN                 │
│      OPENINGS TO FORM THROUGH-DIE VIAS                  │──105
└─────────────────────────────────────────────────────────┘
                            │
┌─────────────────────────────────────────────────────────┐
│ ATTACH SEMICONDUCTOR WAFER TO A WAFER SUPPORT STRUCTURE │
│ SUCH THAT THE BACKSIDE OF THE SEMICONDUCTOR WAFER IS EXPOSED │──106
└─────────────────────────────────────────────────────────┘
                            │
┌─────────────────────────────────────────────────────────┐
│     REMOVE MATERIAL FROM THE BACKSIDE OF THE            │
│  SEMICONDUCTOR WAFER TO FORM OXIDE LAYER HAVING A       │
│  THICKNESS THAT IS LESS THAN THE INITIAL THICKNESS      │──107
└─────────────────────────────────────────────────────────┘
                            │
┌─────────────────────────────────────────────────────────┐
│  ETCH OPENINGS IN THE OXIDE LAYER TO EXPOSE THROUGH-DIE VIAS │──108
└─────────────────────────────────────────────────────────┘
                            │
┌─────────────────────────────────────────────────────────┐
│              DEPOSIT MICRO-BUMPS                        │──109
└─────────────────────────────────────────────────────────┘
                            │
┌─────────────────────────────────────────────────────────┐
│          PLACE STACKED DIE ON MICRO-BUMPS               │──110
└─────────────────────────────────────────────────────────┘
                            │
┌─────────────────────────────────────────────────────────┐
│          PERFORM HEATING PROCESS STEP                   │──111
└─────────────────────────────────────────────────────────┘
```

FIG. 1

STACKED DIE MANUFACTURING PROCESS

FIELD OF THE INVENTION

The invention relates to a method for forming a stacked-die structure on a semiconductor wafer.

BACKGROUND OF THE INVENTION

Integrated circuit die stacking techniques have been developed in which two or more integrated circuit devices are stacked vertically and interconnections are made between them using through-die vias. In conventional stacked-die fabrication processes that use through-die vias, conventional semiconductor fabrication process steps are performed on a semiconductor wafer so as to form a number of dice on the semiconductor wafer that are typically referred to as "base dice." Each base die will include a number of through-die vias that that extend partially through the wafer substrate. The wafer is then flipped so that it is face-side down and it is attached to a wafer support structure. Grinding and polishing processes are then performed to remove material from the backside of the wafer and expose the through-die vias. The exposed through-die vias are then attached to another die, typically referred to as the "stacked die" or "daughter die" to complete the stacked-die structure.

Several attachment mechanisms are known in the art for attaching the semiconductor wafer to the wafer support structure. One of the best wafer-attachment mechanisms is thermally-released double-sided tape. More particularly, strips of double-sided tape are placed between the semiconductor wafer and the support structure, forming a structure that will keep the semiconductor wafer flat and supported during subsequent operations. One of the biggest advantages to the use of thermally-released double-sided tape is the fact that it is easy to separate the semiconductor wafer from the wafer support structure after the manufacturing process is complete, without damaging the semiconductor wafer. Though thermally-released double-sided tape is effective for attaching semiconductor wafers to wafer support structures, they have a low thermal budget (90-200° C.) that prevents subsequent high-temperature operations. More particularly, at temperatures that exceed the thermal budget, these tapes release, which can cause defects in the event of separation of the semiconductor wafer from the wafer support structure during a process step. Though a partial separation may sometimes only produce a decreased yield, often the semiconductor wafer curls, up requiring that the entire semiconductor wafer be scrapped.

Liquid adhesive materials such as epoxy can also be used. Typically, liquid adhesives are applied in liquid form and harden to fasten the semiconductor wafer to the wafer support structure. Though some of these liquid adhesive materials are quite effective for attaching the semiconductor wafers to wafer support structures, they also have low thermal budgets (typically having a maximum temperature of 150-250° C.).

One problem with the use of thermally-released double-sided tape and liquid adhesives having a low thermal budget is the fact that passivation of the backside of the wafer is not possible using conventional passivation processes. More particularly, conventional passivation processes require temperatures in excess of 300° C., making such processes unsuitable for stacked-die fabrication processes that use thermally-released double-sided tape and other low thermal budget materials.

Another problem with conventional fabrication processes for forming stacked-die assemblies using through-die vias are the potential defects that can result from the wafer-thinning process. More particularly, conventional wafer thinning processes use polishing process steps that directly polish the through-die vias. When the through-die vias are made of soft conductive material such as, copper, the over-polishing processes can result in smearing of the metal. This can lead to undesired capacitance, current leakage, and in severe cases could lead to short circuits on the backside of the wafer. Moreover, conventional polishing and grinding processes often create nonuniformities near through-die vias (e.g., local regions that are not planar with the rest of the surface being ground or polished). The occurrence of localized nonuniformities near through-die vias is particularly apparent when the base die has only a small number of through-die vias.

Accordingly, there is a need for a method for forming a stacked-die assembly having a passivation layer on the backside of the semiconductor wafer. Also, there is a need for a process for forming a stacked-die assembly having a passivation layer that will not violate the thermal budget of the thermally-released double-sided tape or the liquid adhesive used to attach the semiconductor wafer to the wafer support structure. In addition, there is a need for a process for forming a stacked-die assembly that does not have through-die via metal smearing and that does not have localized nonuniformities near through-die vias resulting from the wafer thinning process.

SUMMARY OF THE INVENTION

The present invention provides a method for forming a stacked-die structure that includes an oxide layer on the backside of a base die. In the method, device layers are formed on a face side of a semiconductor wafer that includes a buried oxide layer having a first thickness. The device layers define dice, with each die including devices and at least one interconnect region. Metal layers are formed over the device layers that are electrically coupled to the device layers. Openings are etched in the interconnect regions that extend through the semiconductor wafer so as to expose portions of the buried oxide layer. Conductive material is deposited within the openings so as to form through-die vias. The semiconductor wafer is then attached to a wafer support structure and material is removed from the backside of the semiconductor wafer so as to form an oxide layer having a second thickness that is less than the first thickness. Openings are then etched within the backside of the semiconductor wafer so as to expose the through-die vias, micro-bumps are deposited over the through-die vias, and stacked dice are attached to the micro-bumps so as to electrically couple the stacked die to the through-die vias. Thereby, a stacked die structure is formed that includes an oxide layer on the backside of the base die.

Since the oxide layer is formed without performing any high temperature process steps after the semiconductor wafer has been attached to the support structure, thermally-released double-sided tape or adhesive having a low thermal budget can be used to attach the semiconductor wafer to the wafer support structure.

Moreover, the wafer thinning process does not directly grind or polish the through-die vias. Therefore, there is no metal smearing as can result from prior art processes that directly grind and/or polish through-die vias. Also, the resulting surface does not have the nonuniformities that result from prior art grinding and polishing processes that directly grind and polish the through-die vias.

Accordingly, the methods of the present invention allow for forming a stacked-die assembly having a passivation layer on the backside of the semiconductor wafer, and do not exceed the thermal budget of the adhesive material used to attach the semiconductor wafer to the wafer support structure. In addition, the methods of the present invention do not produce through-die via metal smearing or localized nonuniformities near through-die vias that can result from the wafer thinning process. These and other advantages of the present invention will become obvious to those of ordinary skill in the art after having read the following detailed description of the preferred embodiments, which are illustrated in the various drawings.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 1 is a block diagram depicting a method for forming a stacked-die structure in accordance with an embodiment of the invention;

DETAILED DESCRIPTION

FIG. 1 shows a method 100 for forming a stacked-die structure in accordance with an embodiment of the present invention. As shown by step 101, a buried oxide layer is formed in a semiconductor wafer. In the embodiment shown in FIG. 2, a buried oxide layer 22 is shown that is formed on a semiconductor wafer 21. In this embodiment buried oxide layer 22 has an initial thickness T1.

Figure 2:
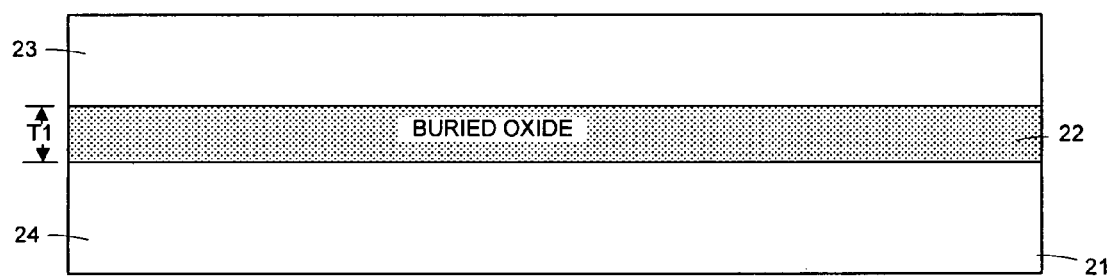
FIG. 2 is a diagram depicting a cross-sectional view of a semiconductor wafer after a buried oxide layer has been formed therein in accordance with an embodiment of the invention.

In the embodiment shown in FIG. 2, the buried oxide layer is located within semiconductor wafer 21 such that a first portion of semiconductor wafer 21 extends above the buried oxide layer, shown as layer 23. A second portion of semiconductor wafer 21 extends below buried oxide layer 22, shown as layer 24. In the present embodiment layers 23 and 24 are bulk silicon, and are not oxidized.

In one embodiment buried oxide layer 22 is formed by implanting oxide into semiconductor wafer 21 and performing a heating process step. In one embodiment a semiconductor wafer 21 is a SIMOX wafer formed using an Ibis Technology SIMOX implanter.

Figure 3:
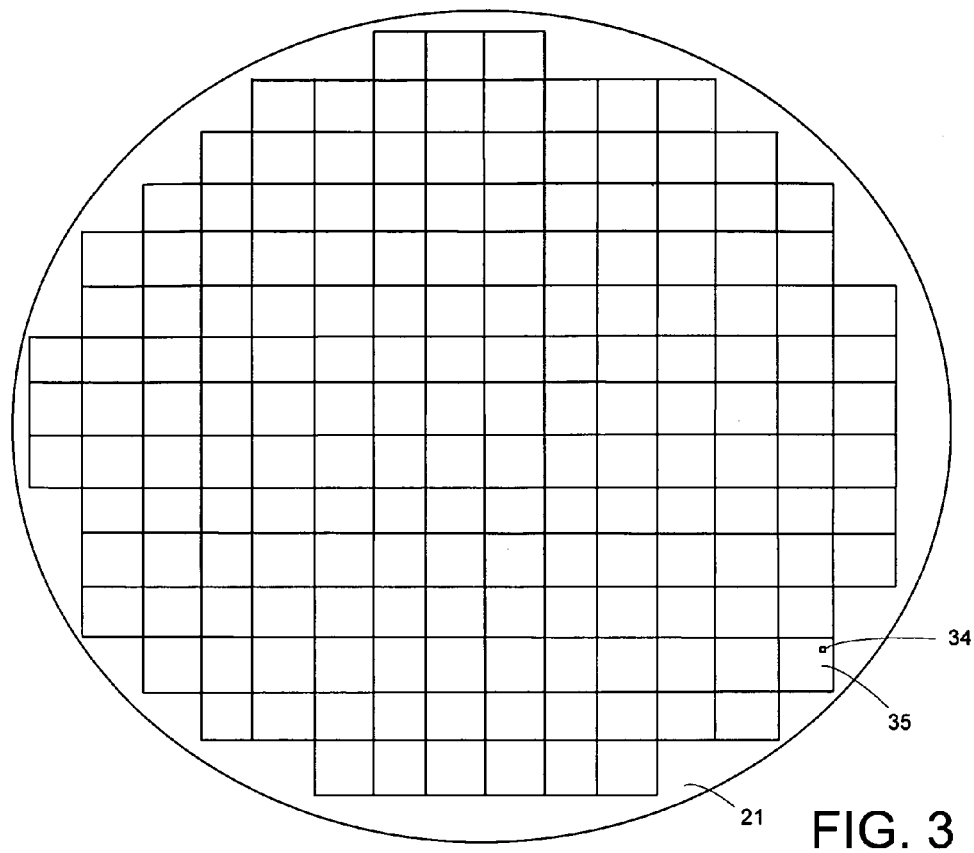
FIG. 3 is a diagram depicting a top view of the semiconductor wafer of FIG. 2 after the formation of device layers in accordance with an embodiment of the invention.
Figure 4:
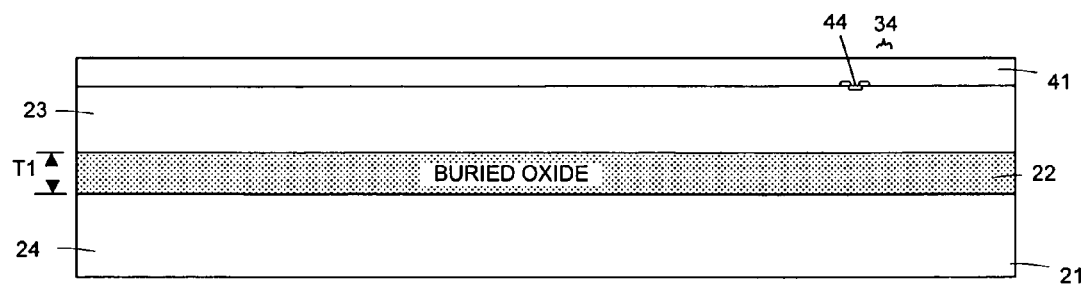
FIG. 4 is a diagram depicting a cross sectional view of a portion of the semiconductor wafer of FIG. 3 which shows a die that includes an interconnect region in accordance with an embodiment of the invention.

Referring now to step 102, a plurality of device layers are formed on a face side of the semiconductor wafer, the device layers defining a plurality of dice, each die including devices and at least one interconnect region. FIGS. 3-4 show an embodiment in which device layers 41 are formed on semiconductor wafer 21 so as to define dice 35. Each die 35 includes devices, represented by exemplary transistor 44 that are formed within device layers 41 and at least one interconnect region 34.

Figure 5:
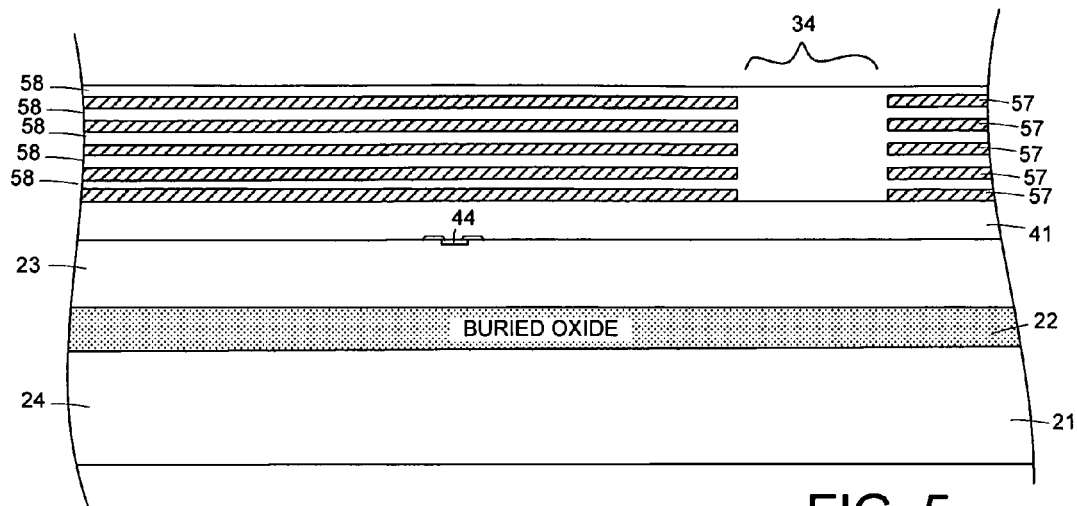
FIG. 5 is a diagram depicting the structure of FIG. 4 after metal layers have been formed that extend over the device layers in accordance with an embodiment of the invention.

As shown by step 103 a plurality of metal layers are formed over the device layers, the plurality of metal layers electrically coupled to the device layers. In the embodiment shown in FIG. 5, metal layers 57 are shown to be formed over device layers 41, with a dielectric layer 58 disposed between adjoining metal layers 57. In the present embodiment metal layers 57 do not extend within interconnect region 34. Instead, dielectric from dielectric layers 58 fill that portion of interconnect region 34 that extends over device layers 41.

Figure 6:
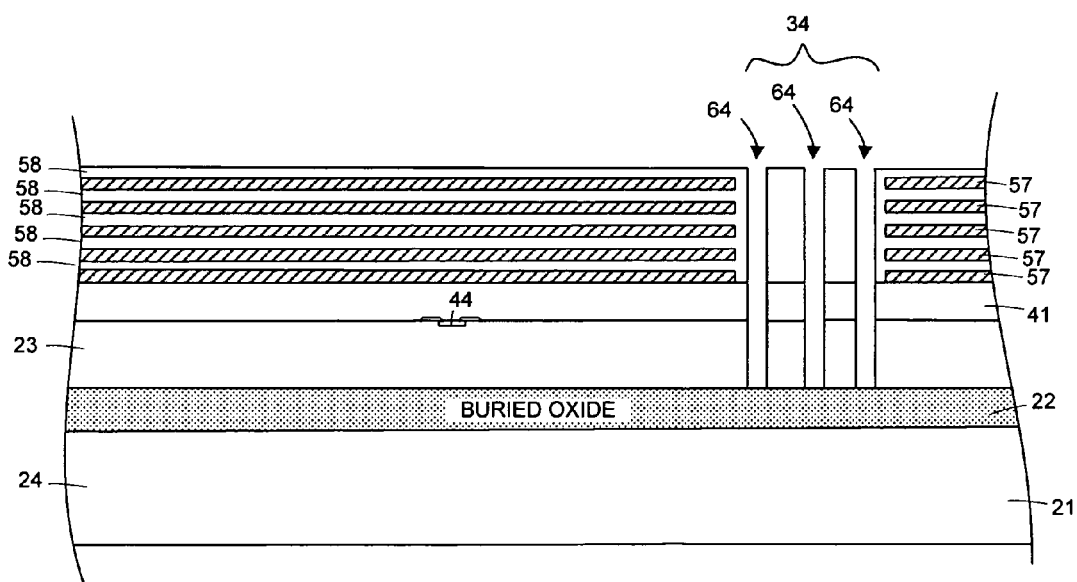
FIG. 6 is a diagram depicting the structure of FIG. 5 after openings have been etched in the interconnect regions to expose portions of the buried oxide layer in accordance with an embodiment of the invention.

Referring now to step 104, openings are etched in the interconnect regions that extend through the semiconductor wafer so as to expose portions of the buried oxide layer. In the embodiment shown in FIG. 6, step 104 forms openings 64 that extend through dielectric layers 58 and through layer 23 of semiconductor wafer 21, exposing portions of buried oxide layer 22. In the present embodiment step 104 uses a selective etch process that stops on the buried oxide layer 22.

Figure 7:
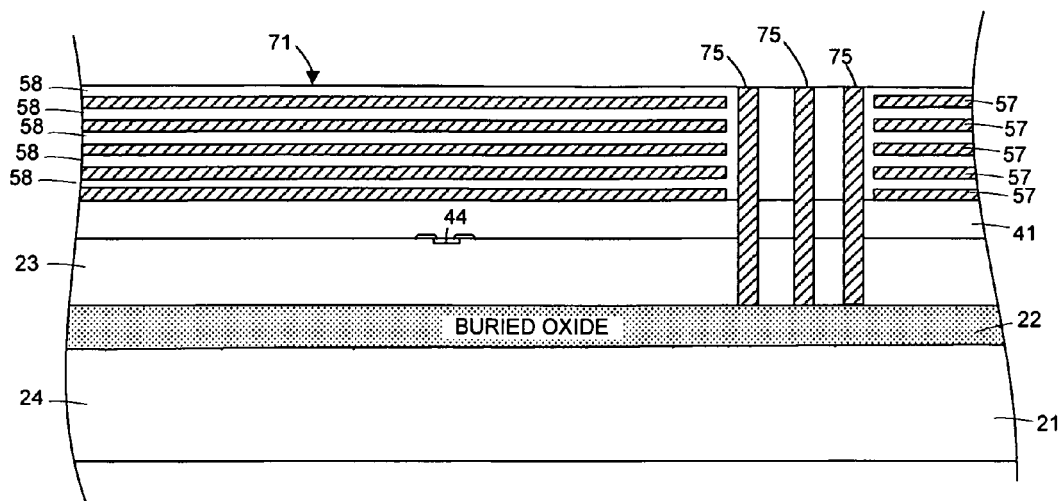
FIG. 7 is a diagram depicting the structure of FIG. 6 after conductive material has been deposited in the openings in accordance with an embodiment of the invention.

As shown by step 105, conductive material is deposited within the openings so as to form through-die vias. In the embodiment shown in FIG. 7, step 105 forms through-die vias 75 within openings 64. In one embodiment a metal layer (e.g., copper) is deposited and that portion of the deposited metal layer that extends over top surface 71 is removed (e.g., by a chemical-mechanical polishing process) to form through-die vias 75. In one specific embodiment copper is deposited into openings 64 using an electroplating process so as to form through-die vias 75 having a height of 100-150 microns.

Figure 8:
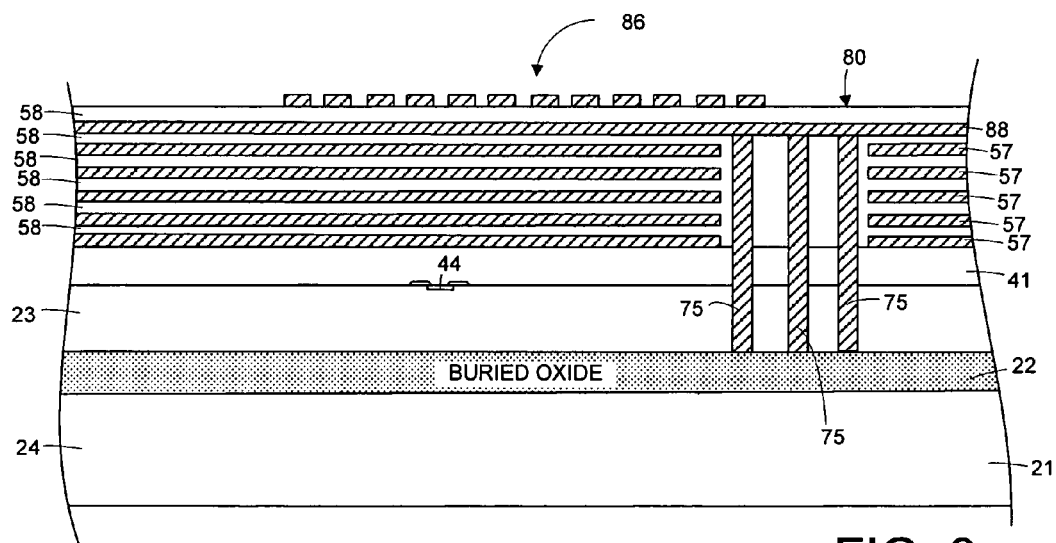
FIG. 8 is a diagram depicting the structure of FIG. 7 after an additional conductive layer, a dielectric layer, and a grid array of contacts have been formed thereover in accordance with an embodiment of the invention.

In the embodiment shown in FIG. 8, an additional metal layer, shown as metal layer 88 is formed over through-die vias 75 so as to electrically couple through-die vias 75 to metal layers 57 and devices 44 within device layers 41. Additional layers are then formed over additional metal layer 88 so as to complete the die. In the present embodiment, this includes deposition of at least one additional dielectric layer so as to form dice having a top surface 80 over which a grid array of contacts 86 are formed. In one embodiment metal layers 57 and additional metal layer 88 are formed by depositing and patterning layers of metal, with vias coupling metal layers 57 together and contacts coupling metal layers 57 to devices 44.

The circuitry on each base die 35 can form any of a number of different types of integrated circuit devices, including but not limited to application specific integrated circuit devices, digital signal processors, etc. In the present embodiment, each base die 35 is a programmable logic device that includes programmable logic devices 44.

Figure 9:
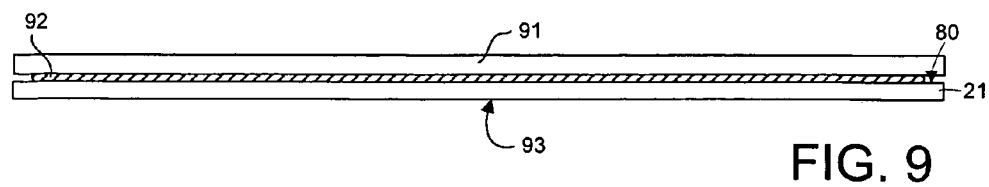
FIG. 9 is a diagram depicting an embodiment in which the structure of FIG. 8 is attached to a wafer support structure using adhesive material in accordance with an embodiment of the invention.

As shown by step 106, the semiconductor wafer is attached to a wafer support structure such that the backside of the wafer is exposed. In the embodiment shown in FIG. 9, semiconductor wafer 21 is shown to be attached to a wafer support structure 91 using adhesive material 92. In one embodiment wafer support structure 91 is a blank wafer. Alternatively, wafer support structure 91 is a glass substrate or another type of substrate that provides sufficient support for subsequent process steps to be performed on backside 93 of semiconductor wafer 21 which is exposed.

In the present embodiment the adhesive material 92 is double-sided tape. More particularly, one side of the thermally-released double-sided tape attaches to wafer support structure 91 and the other side attaches to grid array of contacts 86 and top layer 80. In an alternate embodiment, adhesive material 92 is a layer of liquid adhesive material, such as, for example, epoxy, spin-on dielectric, etc. that are applied in liquid form and that solidify so as to attach semiconductor wafer 21 to wafer support structure 91. Alternatively, adhesive material 92 can include adhesive gel, solid adhesive, or any other material or combination of materials that can effectively fasten wafer 21 to wafer support structure 91 such that semiconductor wafer 21 can be detached without damage after processing is complete.

Figure 10:
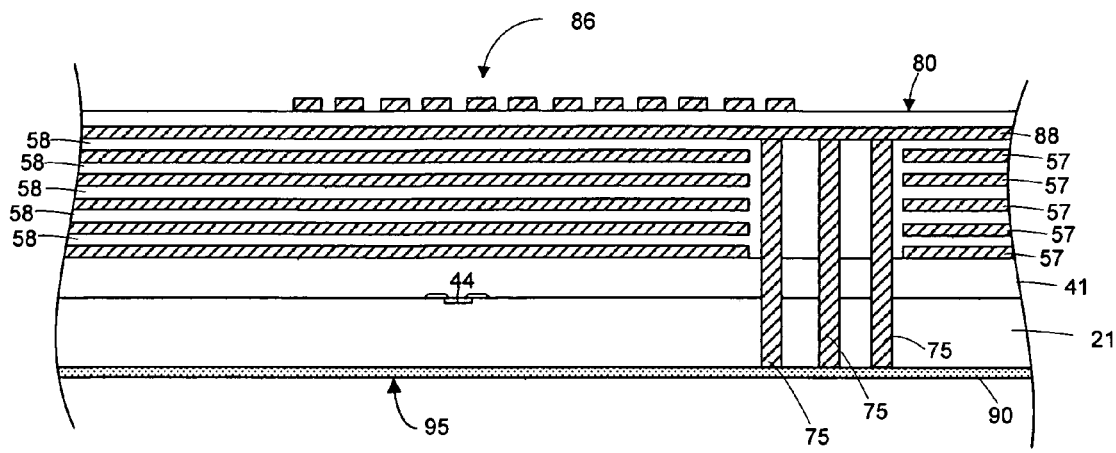
FIG. 10 is a diagram depicting the structure of FIG. 8 after material has been removed from the backside of the semiconductor wafer in accordance with an embodiment of the invention.

Referring to step 107, material is removed from the backside of the semiconductor wafer so as to form an oxide layer having a second thickness that is less than the first thickness. In the embodiment shown in FIG. 10, material is removed from the backside of wafer 21 so as to remove all of layer 24 of semiconductor wafer 21 and remove some of buried oxide layer 22, leaving a remaining portion of buried oxide layer 22 that is shown as oxide layer 90.

In the present embodiment step 107 includes both a grinding process step and a polishing process step. More particularly, a grinding process is performed on backside 93 of semiconductor wafer 21 to remove all of layer 24 and remove some of buried oxide layer 22. A polishing process is then performed to remove more of buried oxide layer 22 to form oxide layer 90. In one embodiment step 107 reduces the wafer thickness to 100-150 microns.

Because the grinding process and the polishing process do not polish or grind through-die vias 75, there is no metal smearing as can occur with prior art processes that directly polish and grind through-die vias. Moreover, since step 107 only grinds and polishes the bulk silicon of semiconductor wafer 21, a planar bottom surface 95 is obtained. Thereby, a bottom surface 95 is obtained that does not include nonuniformities near through-die vias 75 (e.g., nonplanar regions) as occurs with some prior art processes.

Figure 11:
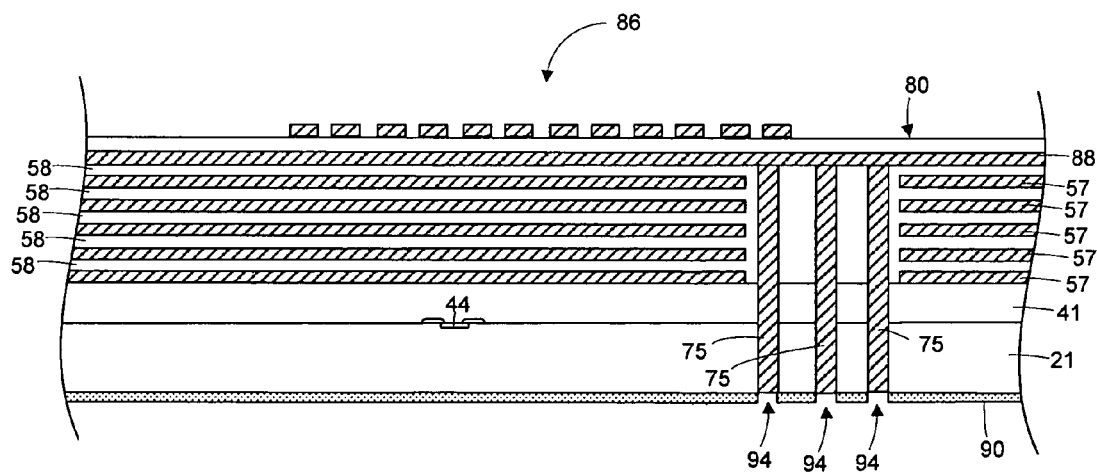
FIG. 11 is a diagram depicting the structure of FIG. 10 after openings have been etched in the oxide layer to expose the through-die vias in accordance with an embodiment of the invention.

Referring now to step 108 openings are etched within the backside of the semiconductor wafer so as to expose the through-die vias. In the embodiment shown in FIG. 11, openings 94 are etched through oxide layer 90 so as to expose a surface of each of through-die vias 75.

One or more stacked dice are then coupled to each base die 35 on the semiconductor wafer. In the present embodiment a low-temperature attachment process is used to electrically couple stacked die to through-die vias 75 and to mechanically couple stacked die to base die 35. More particularly, an attachment process is used that does not utilize a temperature that exceeds the thermal budget of the adhesive material used in step 106. Thereby, method 100 forms a passivation layer (oxide layer 90) while allowing the use of adhesive materials having a low thermal budget for securing the semiconductor die to the wafer attachment mechanism.

Figure 12:
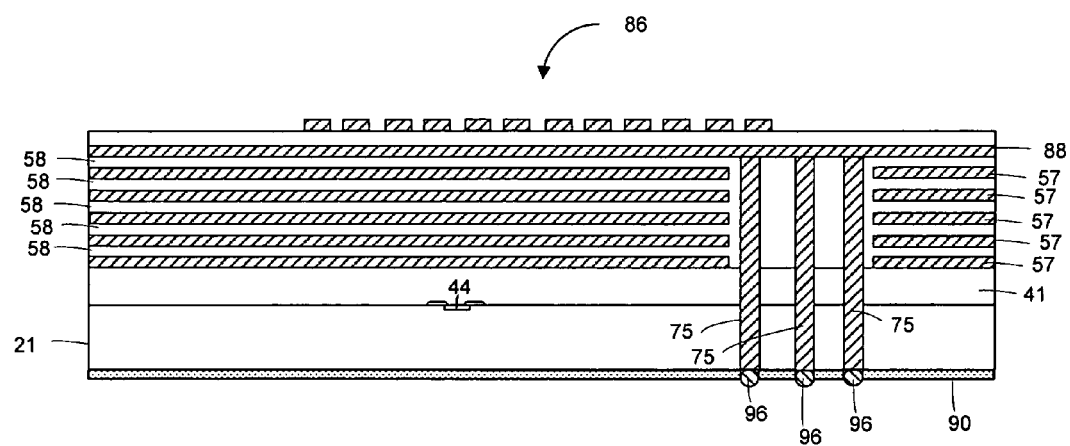
FIG. 12 is a diagram depicting the structure of FIG. 11 after micro-bumps have been deposited in accordance with an embodiment of the invention.

In the embodiment shown in steps 109-111 stacked dice are coupled to through-die vias using micro-bumps. More particularly, as shown by step 109, a plurality of micro-bumps are deposited such that each of the micro-bumps extends over one of the through-die vias. In the embodiment shown in FIG. 12, micro-bumps 96 are shown that attach to each of through-die vias 75. In the present embodiment micro-bumps 96 are eutectic material such an eutectic lead-tin material or low-melting-temperature lead-free solder materials, etc. One or more stacked dice are then placed on the micro-bumps such that the micro-bumps extend over contacts or other conductive surfaces of each stacked die. A heating process step is then performed as shown by step 111 to melt micro-bumps 96, both physically and electrically coupling the stacked die to through-die vias 75.

In the present embodiment the heating process of step 111 is performed at a temperature that is less than the thermal budget for the adhesive material. In one embodiment micro-bumps 96 are eutectic material. In one embodiment micro-bumps 96 are lead-tin solder or lead-free eutectic material and heating process step 111 is performed at a temperature of less than 200 degrees centigrade. In another embodiment heating process step 111 is performed at a temperature of less than 250 degrees Centigrade.

In the present embodiment steps 101-111 are performed in the order shown in FIG. 1. More particularly, forming a buried oxide layer (step 101) is performed first; followed by forming device layers (step 102); which is followed by forming metal layers (step 103); which is followed by etching openings (step 104); which is followed by depositing conductive material (step 105); which is followed by attaching the semiconductor wafer to a wafer support structure (step 106); which is followed by removal of material from the backside of the semiconductor wafer (step 107); which is followed by etching of openings (108) which is followed by depositing micro bumps (step 109); which is followed by placing the stacked die on the micro-bumps (step 110); which is followed by the heating process step (step 111).

In the present embodiment after attaching the semiconductor wafer to the wafer support structure in step 106, steps 107-111 are performed sequentially, while the semiconductor wafer is attached to the wafer support structure, and the semiconductor wafer is not detached from the wafer support structure until after the stacked dice have been attached in step 111. Moreover, process steps 107-111 are performed at temperatures that do not exceed the thermal budget of the adhesive material used in step 106. In one embodiment adhesive material 91 is thermally-released double-sided tape (e.g., Nitto Denko RevAlpha tape) having a thermal budget of 200 degrees Centigrade. In this embodiment all of process steps 107-111 are performed at temperatures less than 200 degrees Centigrade. Accordingly the thermal budget (e.g., 200° C.) is not exceeded.

In the present embodiment, after heating process step 111 is performed, the semiconductor wafer is detached from the wafer support system 91 and a singulation process is performed to form individual dice.

Figure 13:
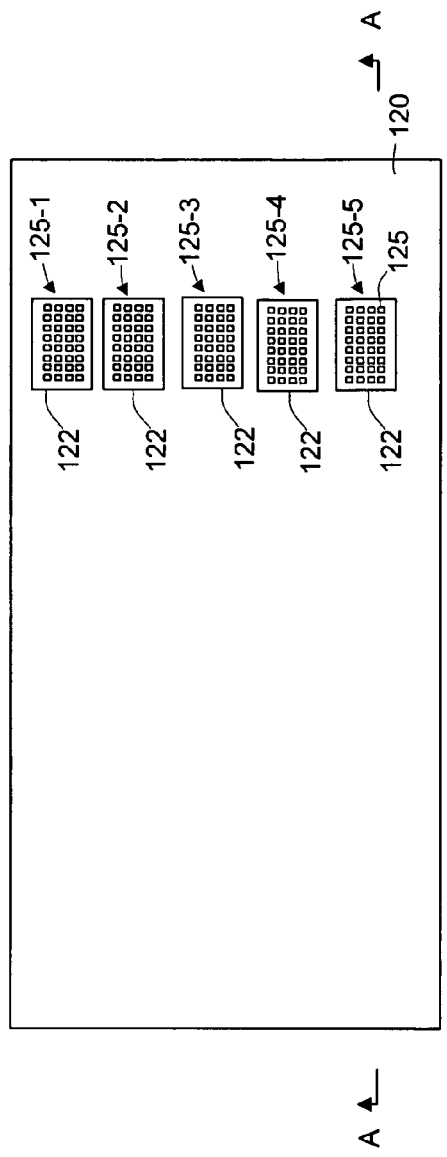
FIG. 13 is a diagram depicting a portion of a base die to which stacked dice have been attached, and wherein the micro-bumps are not shown and only the outline of each stacked die is shown in accordance with an embodiment of the invention.
Figure 14:
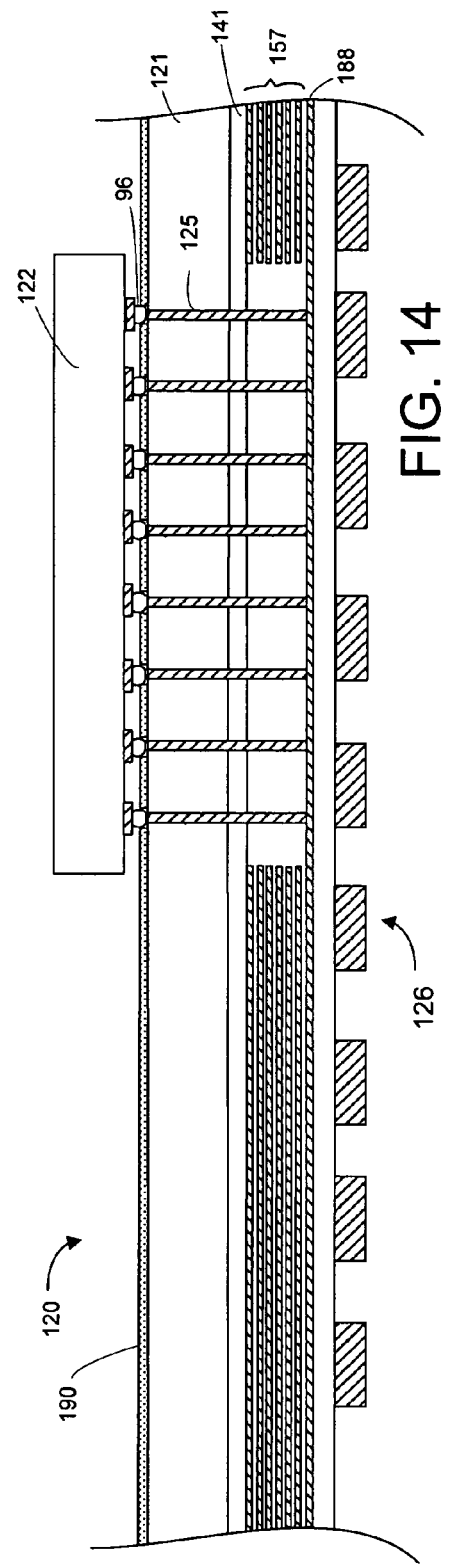
FIG. 14 is a diagram depicting a cross-sectional view of a portion of the structure of FIG. 13 along cross section A-A in accordance with an embodiment of the invention.

FIGS. 13-14 show an exemplary completed stacked-die structure formed in accordance with steps 101-111 of FIG. 1. In this embodiment five stacked dice 122 are coupled to through-die vias 125 using micro-bumps 96 that have been heated so as to electrically and mechanically couple each stacked die 122 to through-die vias 125 of base die 120.

In the embodiment shown in FIGS. 13-14 base die 120 includes five grid arrays of through-die vias, shown as grid arrays 125-1 through 125-5 that are arranged in a column on base die 120. In this embodiment base die 120 also includes an oxide layer 190, metal layers 157 and 188, and contacts 126 that are formed on semiconductor wafer 121.

Figure 15:
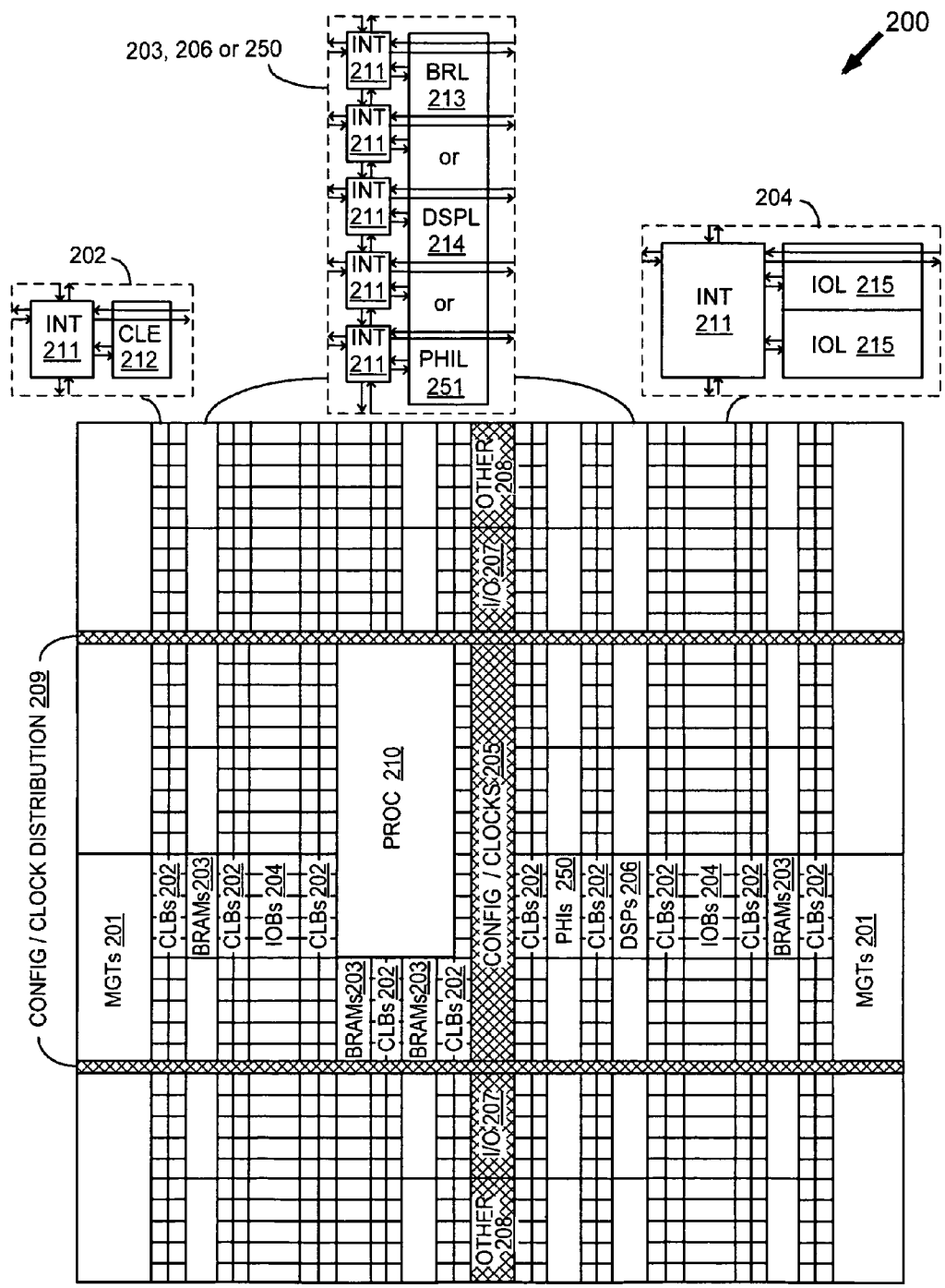
FIG. 15 is a block diagram depicting an exemplary field programmable gate array architecture in accordance with an embodiment of the invention.

In one embodiment that is shown in FIG. 15 each base die 120 is a FPGA die having a FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 15.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as five CLBs, but other numbers (e.g., six) can also be used. A DSP tile 206 can include a DSP logic element (DSPL 214) in addition to an appropriate number of programmable interconnect elements. An 10B 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 15) is used for configuration, clock, and other control logic. Horizontal areas 209 extending from this column are used to distribute the clocks and configuration signals across the breadth of the FPGA.

Some FPGAs utilizing the architecture illustrated in FIG. 15 include additional logic blocks that disrupt the regular columnar structure making up a large part of the FPGA. The additional logic blocks can be programmable blocks and/or dedicated logic. For example, the processor block PROC 210 shown in FIG. 15 spans several columns of CLBs and BRAMs.

Note that FIG. 15 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 15 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

FPGA 200 also includes one or more interface tiles 250 arranged in a column. In the present embodiment, interface tiles 250, also referred to as programmable heterogeneous integration tiles (PHI) tiles, are operable for interconnection to one or more other integrated circuit dice stacked on the back side of the die of FPGA 200. In the embodiment shown, FPGA architecture 200 includes a single column of interface tiles 250. Although only a single column of interface tiles 250 is shown, it is to be understood that FPGA architecture 200 may generally include one or more columns of interface tiles 250. In other embodiments FPGA 200 may include less than an en entire column of interface tiles 250.

In the present embodiment each Interface tile 250 includes a programmable logic element 251 that can be referred to hereinafter as a programmable heterogeneous logic element (PHIL), in addition to an appropriate number of programmable interconnect elements.

Figure 16:
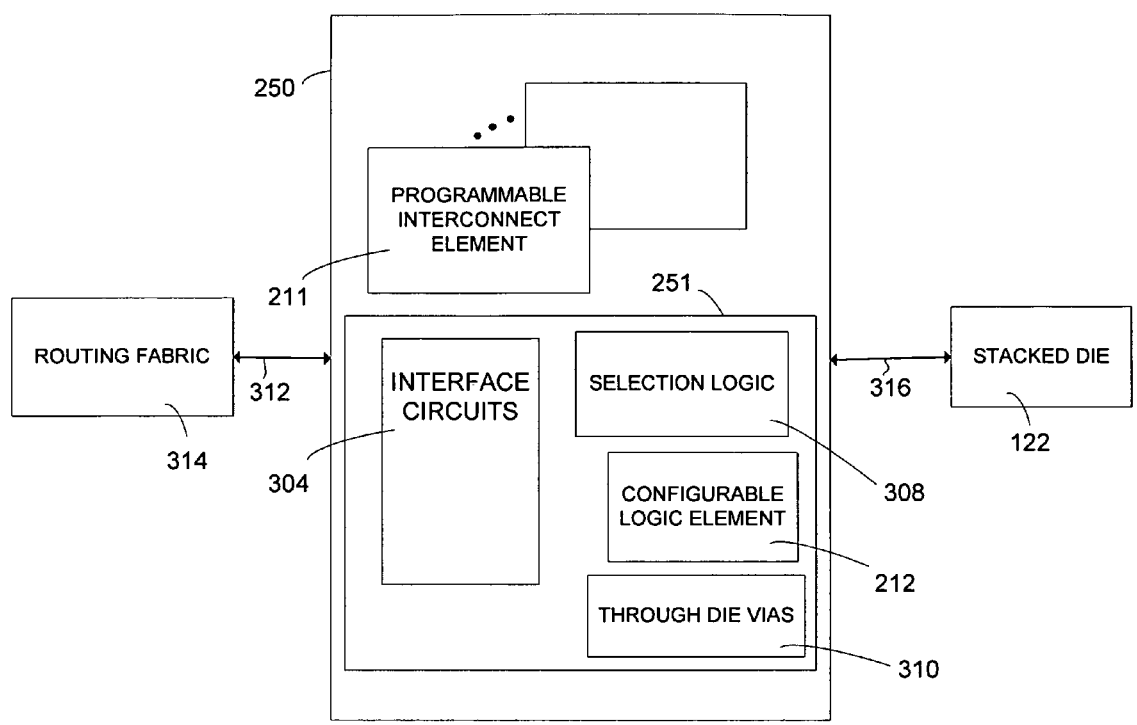
FIG. 16 is a block diagram depicting an interface tile that illustrates the connections between the interface tile and a stacked die in accordance with an embodiment of the invention.

In the embodiment shown in FIG. 16, an exemplary interface tile 250 is shown that includes one or more programmable interconnect elements 211 and a programmable logic element 251 that includes configurable logic element 212, interface circuits 304, selection logic 308, and a plurality of through-die vias 310. Interface tile 250 includes an interface 312 to routing fabric 314 of the FPGA. The interface 312 includes various routing conductor segments that form part of the FPGA routing fabric 314. Interface tile 250 includes an interface 316 with stacked die 122 (that can includes, for example, micro-bumps) electrically coupled to conductive interconnect of the stacked die 122.

Each of the programmable interconnect elements 211 includes programmable multiplexing structures that couple the interface tile 250 to the routing conductor segments of interface 312. Configurable logic element 212 includes one or more slices of logic having lookup tables (LUTs), multiplexers, flip-flops, and the like.

Interface circuits 304 facilitate communication between the FPGA routing fabric 314 and stacked die 122 through the through-die vias 310. More particularly, through-die vias 310 are electrically coupled to the contacts on the backside of the FPGA die and are electrically coupled to interface circuits 304. The selection logic 308 is configured to selectively change the function of interface tile 250 between the functionality of a programmable logic tile (e.g., a CLB) and an interface function. In the present embodiment the interface function operably couples the stacked die 122 to routing fabric 314. For example, selection logic 308 may be configured such that signals received from FPGA routing fabric 314 are coupled to configurable logic element 212, and signals produced by configurable logic element 212 are coupled to FPGA routing fabric 314. In other words, selection logic 308 causes interface tile 250 to operate similar to a CLB tile (e.g., CLB 102). Alternatively, selection logic 308 may be configured such that signals received from FPGA routing fabric 314 are coupled to stacked die 122 (through interface circuits 304 and through-die vias 310) and signals produced by stacked die 122 are coupled to FPGA routing fabric 314 (through interface circuits 304 and through-die vias 310). In other words, selection logic 308 cause interface tile 250 to operate as an interface between FPGA routing fabric 314 and stacked die 122. The function of interface tile 250 as implemented by selection logic 308 may be controlled by the configuration memory cells of the FPGA (not shown) or by a control signal either external to or internal to interface tile 250.

In some embodiments, interface circuits 304 provide voltage level translation. In some cases interface tile 250 and the FPGA may operate using a different supply voltage than stacked die 122. In this embodiment interface circuits 304 translate the voltage of signals originating from FPGA routing fabric 314 and destined for stacked die 122 to the voltage required by stacked die 122. Likewise, interface circuits 304 translate the voltage of signals originating from stacked die 122 and destined for FPGA routing fabric 314 to the voltage required by the FPGA. In some embodiments, interface circuits 304 also provide for registering of signals coupled from FPGA routing fabric 314 to stacked die 122, and signals coupled from stacked die 122 to FPGA routing fabric 314.

Figure 17:
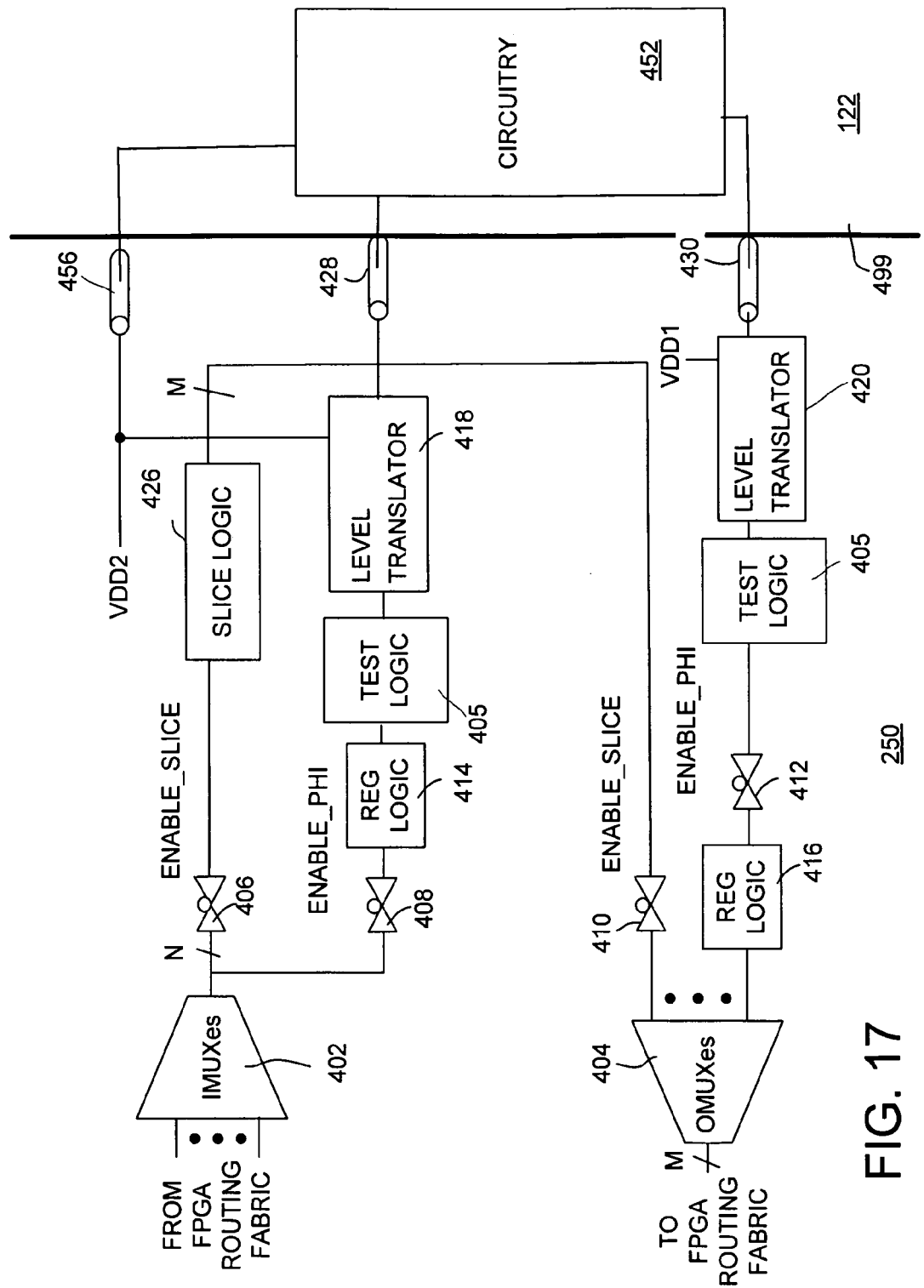
FIG. 17 is a block diagram depicting a more detailed embodiment of an interface tile that illustrates the connections between the interface tile and a stacked die in accordance an embodiment of the invention.

FIG. 17 is a block diagram depicting a more detailed embodiment of an exemplary interface tile 250 that includes input multiplexing logic (IMUXes 402), output multiplexing logic (OMUXes 404), three-state buffers 406, 408, 410, and 412, register logic 414 and 416, level-translation circuits 418 and 420, test logic 422, slice logic 426, and through-die vias 428, 430 and 456. With respect to FIG. 16, three-state buffers 406 through 412 comprise selection logic 308. Register logic 414, level-translation circuit 418, and test logic 405 comprise a first interface circuit of interface circuits 304. Register logic 416, level-translation circuit 420, and test logic 405 comprise a second interface circuit of interface circuits 304. The IMUXes 402 and OMUXes 404 comprise the programmable interconnect elements. The slice logic 426 comprises the configurable logic element.

Inputs of IMUXes 402 are coupled to FPGA routing fabric 214. An output of IMUXes 402 is coupled to inputs of three-state buffers 406 and 408, respectively. The output of the IMUXes 402 illustratively includes N terminals, where N is an integer greater than zero (i.e., IMUXes 402 include N multiplexers). IMUXes 402 are configured to couple selected routing conductors of the FPGA routing fabric to three-state buffers 406 and 408.

An output of three-state buffer 406 is coupled to an input of slice logic 426. Slice logic 426 includes a plurality of slices. Each of the slices includes various logic elements, including LUTs, flip-flops, combinatorial logic, and the like. An output of three-state buffer 408 is coupled to an input of register logic 414. Register logic 414 includes a plurality of registers (e.g., flip-flops). For example, register logic 414 may include N flip-flops, one for each terminal of the output of IMUXes 402.

A control input of three-state buffer 406 is configured to receive an enable_slice signal. A control input of three-state buffer 408 is configured to receive an enable_PHI signal. The enable_slice and enable_PHI signals may be generated externally to interface tile 150 or may be set by configuration memory cells. If the enable_slice signal is active, the outputs of IMUXes 402 are coupled to the slice logic 426. If the enable_slice signal is inactive, three-state buffer 406 provides a high-impedance output for slice logic 426. Likewise, if the enable_PHI signal is active, the outputs of IMUXes 402 are coupled to register logic 414. If the enable_PHI signal is inactive, three-state buffer 408 provides a high-impedance output for register logic 414. In this manner, the enable_slice and enable_PHI signals control whether IMUXes 402 drive slice logic 426 and/or register logic 414. In one embodiment, three-state buffers 406 and 408 are configured such that IMUXes 402 drive either slice logic 426 or register logic 414.

An output of slice logic 426 is coupled to an input of three-state buffer 410. The output of slice logic 426 is illustratively shown as having M terminals, where M is an integer greater than zero. An output of three-state buffer 410 is coupled to inputs of OMUXes 404. OMUXes 404 include M multiplexers. An output of three-state buffer 412 is coupled to an input of register logic 416. An output of register logic 416 is coupled to the inputs of OMUXes 404. Register logic 416 includes a plurality of registers (e.g., flip-flops). For example, register logic 416 may include M flip-flops. A control input of three-state buffer 410 is configured to receive the enable_slice signal. A control input of three-state buffer 412 is configured to receive the enable_PHI signal. Three-state buffers 410 and 412 operate in a manner similar to three-state buffers 406 and 408. An output of OMUXes 404 is coupled to FPGA routing fabric 314.

Using three-state buffers 406-412, interface tile 150 may function as a CLB or as an interface tile for interfacing stacked die 122. Three-state buffers 406 and 410 may be active, causing input signals to pass from IMUXes 402 through slice logic 426, and output signals to pass from slice logic 426 to OMUXes 404. Alternatively, three-state buffers 408 and 412 may be active, causing input signals to pass from IMUXes 402 through register logic 414, level-translation circuit 418, test logic 405, and through-die vias 428 to circuitry 452 on stacked die 122, and output signals to pass through through-die vias 430, test logic 405, level-translation circuit 420, and register logic 416 to the OMUXes 404.

An output of register logic 414 is coupled to an input of the level-translation circuit 418 through test logic 405. An output of level translation circuit 418 is coupled to through-die vias 428. Through-die vias 428 are electrically coupled to circuitry 452 in stacked die 122. Stacked die 122 is electrically and mechanically coupled to the backside of the die of the FPGA die that includes interface tile 250. The circuitry 452 is illustratively configured to receive a pair of voltage supplies, denoted as VDD1 and VDD2. The voltage supplies VDD2 is provided to stacked die 122 through the through-die via 456.

A line 499 demarcates the boundary between the FPGA die that includes interface tile 250 and stacked die 122.

Another input of the level-translation circuit 418 is configured to receive the supply voltage VDD2. Assume the FPGA (and hence the interface tile 250) operates using the voltage supply VDD1, and the circuitry 452 of stacked die 122 operates using the voltage supply VDD2. The level-translation circuit 418 is configured to translate the voltage of signals received from the register logic 414 from VDD1 to VDD2. This allows the signals provided by the register logic 414 to properly drive the circuitry 452.

In the present example, through-die vias 428 include N through-die vias for providing N signals to circuitry 452 in stacked die 122. In the present embodiment through-die vias 430 include M through-die vias for receiving M signals from the circuitry 452 in stacked die 122. Through-die vias 430 are electrically and mechanically coupled to the backside of the FPGA die that includes interface tile 250. An input of level-translation circuit 420 is electrically coupled to through-die vias 430. An output of level translation circuit 420 is coupled to an input of three-state buffer 412 through test logic 405. Test logic 405 cooperates with corresponding test circuitry on stacked die 122 to provide a scan chain.

Another input of the level-translation circuit 420 is configured to receive the supply voltage VDD1. Level-translation circuit 420 is configured to translate the voltage of signals received from the circuitry 452 in stacked die 122 from VDD2 to VDD1. This allows the signals provided by stacked die 122 to properly drive circuitry in the FPGA that uses the VDD1 supply voltage.

Figure 18:
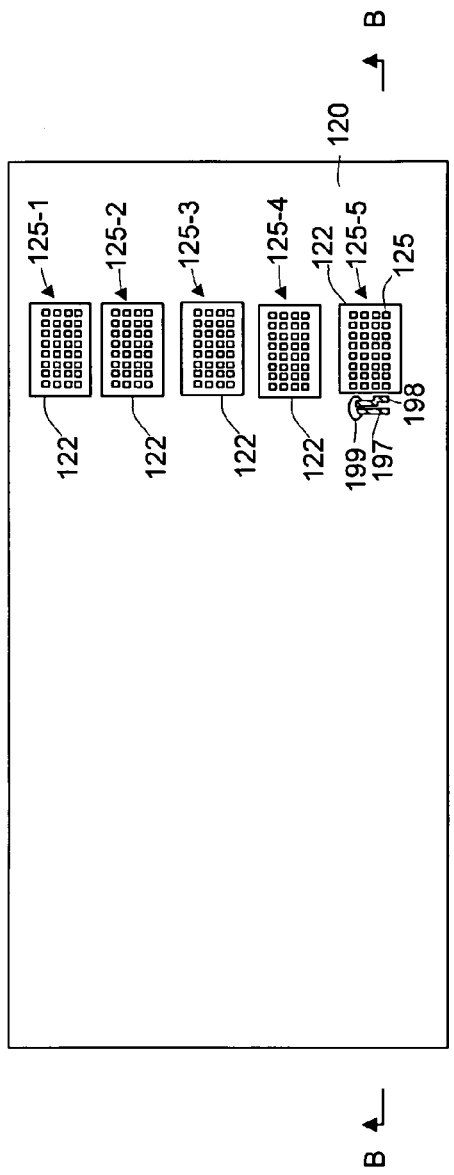
FIG. 18 is a diagram depicting an embodiment in which five stacked dice are attached to a base die, wherein the base die includes interconnects disposed on the backside of the semiconductor wafer that couple to through-die vias and to a capacitor, wherein the micro-bumps are not shown and only the outline of each stacked die is shown in accordance with an embodiment of the invention.
Figure 19:
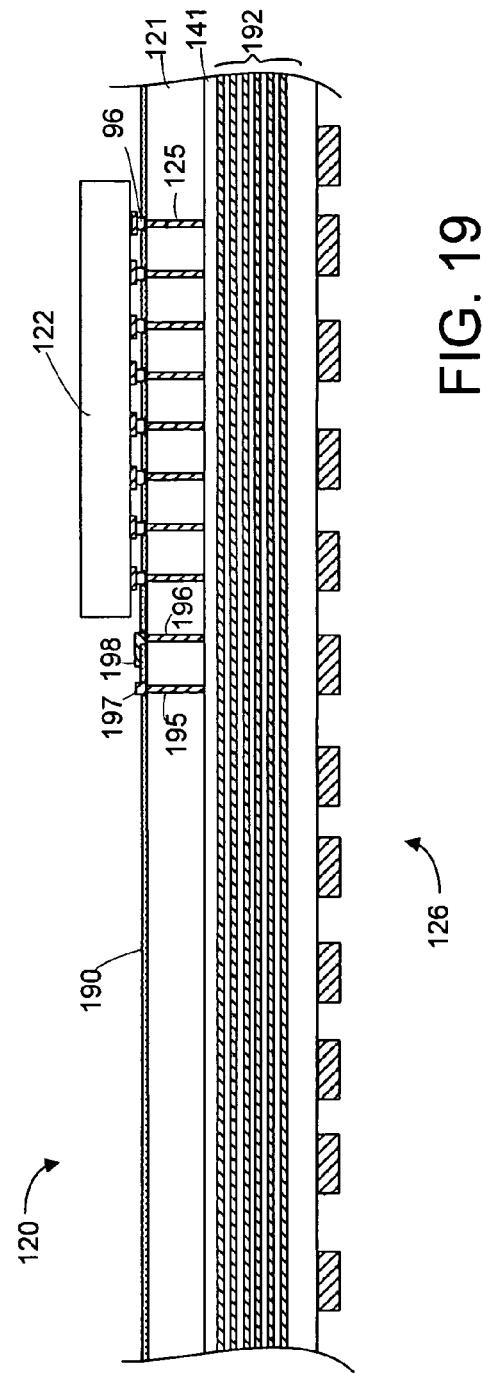
FIG. 19 is a diagram depicting a cross-sectional view of a portion of the structure of FIG. 18 along cross section B-B, and further illustrates an embodiment in which a via-first fabrication process is used in accordance with an embodiment of the invention.

FIGS. 18-19 show an embodiment of a stacked-die structure in which each base die 120 includes a capacitor 199. In the present embodiment capacitor 199 is coupled to the other circuitry of base die 120 by through-die vias 195-196 and metal interconnects 197-198. More particularly, metal interconnect 197 couples on one end to capacitor 199 and on the other end to through-die via 195. Metal interconnect 198 couples on one end to capacitor 199 and on the other end to a through-die via 196. Through-die vias 195-196 couple to device layers 141 so as to couple capacitor 199 to device layers 141. Though capacitor 199 is shown to be coupled to through-die vias 195-196, alternatively, one or more capacitor 199 could be coupled to only stacked die 122, using metal interconnects that couple only to stacked die 122 (e.g. using micro-bumps that attach to the metal interconnect and to stacked die 122). In another embodiment metal interconnects could couple on one end to one or more capacitor 199 and on the other end to both stacked die 122 and to through-die vias 125. In the present embodiment capacitor 199 is a metal to silicon capacitor that is formed on oxide layer 190, which uses oxide layer 190 as a dielectric layer. However, other structures and devices could be formed on oxide layer 190 and coupled to device layers 141 and/or stacked die 122 in a similar manner.

In one embodiment a via-last fabrication process as shown in FIGS. 1-14 is used to form base die 120 shown in FIG. 18. In the embodiment shown in FIG. 19, a via-first fabrication process is used to form base die 120. In this embodiment some of method steps 101-111 are performed in a different order than shown in FIG. 1. More particularly, through-die via etch and through-die via deposition process steps 104-105 are performed before steps 102-103. Since through-die vias 125 are formed before metal layers 192 are formed, there is no need to have an opening in each metal layer 192 between through-die vias 125 and contacts 126. In the present embodiment the process steps for forming capacitor 199 are performed at temperatures that do not exceed the thermal budget of the adhesive material used in step 106 and the process steps for forming capacitor 199 are performed after step 107, while semiconductor substrate 121 is still attached to wafer support structure 91. In addition, all of the process steps for forming capacitor 199 and process steps 107-111 are performed without removing semiconductor wafer 121 from wafer support structure 91 at temperatures that do not exceed the thermal budget of adhesive material 92.

Not only do the methods of the present invention allow for the formation of an oxide layer on the backside of the semiconductor wafer, but also the methods of the present invention allow for forming other devices on the backside of the wafer without exceeding the thermal budget of the material used to attach the semiconductor wafer to the wafer support structure. Accordingly, the methods of the present invention allow for forming a stacked-die assembly having a passivation layer on the backside of the semiconductor wafer and other devices on the backside of the wafer, without exceeding the thermal budget of the adhesive material used to attach the semiconductor wafer to the wafer support structure. Also, the methods of the present invention do not produce through-die via metal smearing or localized nonuniformities near through-die vias as can occur in prior art process in which through-die vias are directly ground and polished. In addition to the above advantages, when a selective etch process is used that is selective to oxide, the depth of through-die via openings 64 is precisely controlled, preventing defects that can result from through-die vias that are too shallow.

The preferred embodiment of the present invention is thus described. While the present invention has been described in particular embodiments, it should be appreciated that the present invention should not be construed as limited by such embodiments, but rather construed according to the following claims.

What is claimed is:

1. A method for forming a stacked-die structure comprising:
    forming a plurality of device layers on a face side of a semiconductor wafer that includes a buried oxide layer having a first thickness, the plurality of device layers defining a plurality of dice, each die including at least one interconnect region;
    forming a plurality of metal layers over the plurality of device layers, the plurality of metal layers electrically coupled to the plurality of device layers;
    etching openings in the interconnect regions that extend through the semiconductor wafer so as to expose portions of the buried oxide layer;
    depositing conductive material within the openings so as to form through-die vias;
    removing material from a backside of the semiconductor wafer so as to form an oxide layer having a second thickness that is less than the first thickness;
    etching openings within the backside of the semiconductor wafer so as to expose the through-die vias; and
    coupling a stacked die to the through-die vias.

2. The method for forming a stacked-die structure according to claim 1 further comprising:
    attaching the face side of the semiconductor wafer to a wafer support structure using adhesive material such that the backside of the semiconductor wafer is exposed; and
    wherein the removing material from the backside of the semiconductor wafer and the etching openings within the backside of the semiconductor wafer are performed while the face side of the semiconductor wafer is attached to the wafer support structure.

3. The method for forming a stacked-die structure according to claim 2 wherein the adhesive material has a thermal budget, and wherein the removing material from the backside of the semiconductor wafer, the etching openings within the backside of the semiconductor wafer and the coupling a stacked die to the through-die vias are all performed at a temperatures that do not exceed the thermal budget.

4. The method for forming a stacked-die structure according to claim 2 wherein the coupling a stacked die to the through-die vias further comprises:
   depositing a plurality of micro-bumps such that each of the plurality of micro-bumps extends over one of the through-die vias;
   placing a stacked die on the plurality of micro-bumps; and
   heating the plurality of micro-bumps so as to electrically couple the stacked die to the through-die vias.

5. The method for forming a stacked-die structure according to claim 2 wherein the removing material from the backside of the semiconductor wafer further comprises:
   performing a grinding process on the backside of the semiconductor wafer; and
   performing a polishing process on the backside of the semiconductor wafer, the grinding process and the polishing process removing those portions of the semiconductor wafer that extend between the buried oxide layer and the backside of the semiconductor wafer and removing a portion of the buried oxide layer as to form the oxide layer.

6. The method for forming a stacked-die structure according to claim 2 wherein the etching openings in the interconnect regions further comprises performing a selective etch process, the selective etch process stopping on the buried oxide layer.

7. The method for forming a stacked-die structure according to claim 6 wherein the through-die vias are formed using a via-first process in which the buried oxide layer is formed prior to the forming a plurality of device layers and the etching openings in the interconnect regions is performed prior to the forming a plurality of metal layers.

8. The method for forming a stacked-die structure according to claim 2 further comprising forming at least one additional metal layer on the face side of the semiconductor wafer that is electrically coupled to the through-die vias and the plurality of device layers, the additional metal layer formed after the depositing conductive material within the openings so as to form through-die vias and before the removing material from the backside of the semiconductor wafer.

9. A method for forming a stacked-die structure comprising:
   forming a semiconductor wafer that includes a buried oxide layer having a first thickness;
   forming a plurality of device layers on a face side of the semiconductor wafer, the plurality of device layers defining a plurality of dice, each die including devices and at least one interconnect region;
   forming a plurality of metal layers over the plurality of device layers, the plurality of metal layers electrically coupled to the plurality of device layers;
   etching openings in the interconnect regions using a selective etch process, the selective etch process stopping on the buried oxide layer;
   depositing conductive material within the openings so as to form through-die vias;
   attaching the semiconductor wafer to a wafer support structure such that the backside of the semiconductor wafer is exposed;
   removing material from the backside of the semiconductor wafer so as to form an oxide layer having a second thickness that is less than the first thickness;
   etching openings within the backside of the semiconductor wafer so as to expose the through-die vias;
   depositing a plurality of micro-bumps such that each of the plurality of micro-bumps extends over one of the through-die vias;
   placing a plurality of stacked die on the plurality of micro-bumps; and
   heating the plurality of micro-bumps so as to electrically couple the stacked die to the through-die vias.

10. The method for forming a stacked-die structure according to claim 9 wherein the removing material from the backside of the semiconductor wafer, the etching openings within the backside of the semiconductor wafer, the depositing a plurality of micro-bumps, the placing a plurality of stacked die on the plurality of micro-bumps and the heating are performed while the semiconductor wafer is attached to the wafer support structure.

11. The method for forming a stacked-die structure according to claim 10 wherein the attaching the semiconductor wafer to a wafer support structure further comprises attaching the face side of the semiconductor wafer to a wafer support structure using adhesive material having a thermal budget, and wherein none of the steps of removing material from the backside of the semiconductor wafer, etching openings within the backside of the semiconductor wafer, depositing a plurality of micro-bumps, the placing a plurality of stacked die on the plurality of micro-bumps and the heating are performed at temperatures that do not exceed the thermal budget.

12. The method for forming a stacked-die structure according to claim 11 wherein the adhesive material is thermally-released double-sided tape.

13. The method for forming a stacked-die structure according to claim 11 wherein the adhesive material comprises a layer of liquid adhesive.

14. The method for forming a stacked-die structure according to claim 13 wherein the removing material from the backside of the semiconductor wafer further comprises:
   performing a grinding process on the backside of the semiconductor wafer; and
   performing a polishing process on the backside of the semiconductor wafer, the grinding process and the polishing process removing those portions of the semiconductor wafer that extend between the buried oxide layer and the backside of the semiconductor wafer and removing a portion of the buried oxide layer as to form the oxide layer.

15. The method for forming a stacked-die structure according to claim 14 wherein the forming a plurality of device layers form field programmable gate array device die.

16. The method for forming a stacked-die structure according to claim 15 wherein the through-die vias are formed using a via-last process in which the buried oxide layer is formed prior to the forming a plurality of device layers, the forming a plurality of device layers is performed prior to the forming a plurality of metal layers, and further wherein the forming a plurality of metal layers is performed prior to the etching openings in the interconnect regions, the method further comprising:
   forming at least one additional metal layer on the face side of the semiconductor wafer that is electrically coupled to the through-die vias and the plurality of device layers, the additional metal layer formed after the depositing conductive material within the openings so as to form through-die vias and before the removing material from the backside of the semiconductor wafer.

17. A method for forming a stacked-die structure comprising:
- forming a plurality of device layers on a face side of a semiconductor wafer that includes a buried oxide layer having a first thickness, the plurality of device layers defining a plurality of dice, each die including devices and at least one interconnect region;
- forming a plurality of metal layers over the plurality of device layers, the plurality of metal layers electrically coupled to the plurality of device layers;
- etching openings in the interconnect regions that extend through the metal layers, the plurality of device layers and through the semiconductor wafer so as to expose portions of the buried oxide layer;
- depositing conductive material within the openings so as to form through-die vias;
- forming at least one additional metal layer on the face side of the semiconductor wafer that is electrically coupled to the through-die vias and the devices such that each die region forms a field programmable gate array die having a routing fabric and at least one interface tile that is coupled to the routing fabric, the interconnect region disposed within an interface tile;
- attaching the semiconductor wafer to a wafer support structure using adhesive material having a thermal budget;
- removing material from the backside of the semiconductor wafer so as to form an oxide layer having a second thickness that is less than the first thickness; and
- etching openings within the backside of the semiconductor wafer so as to expose the through-die vias.

18. The method for forming a stacked-die structure according to claim 17 further comprising coupling a stacked die to the through-die vias.

19. The method for forming a stacked-die structure according to claim 17 wherein the removing material from the backside of the semiconductor wafer, the etching openings within the backside of the semiconductor wafer, and the coupling a stacked die to the through-die vias are performed while the semiconductor wafer is attached to the wafer support structure and are performed at a temperature that does not exceed a thermal budget.

20. The method for forming a stacked-die structure according to claim 18 further comprising;
- forming metal interconnects on the oxide layer, the metal interconnects electrically coupled to some of the through-die vias; and
- forming metal to silicon capacitors on the backside of the semiconductor wafer, the metal to silicon capacitors electrically coupled to the metal interconnects.

* * * * *